Aug. 31, 1965 C. C. IH 3,204,122
TWO-WAY CURRENT STEERING SWITCHING CIRCUIT
Filed Sept. 13, 1962
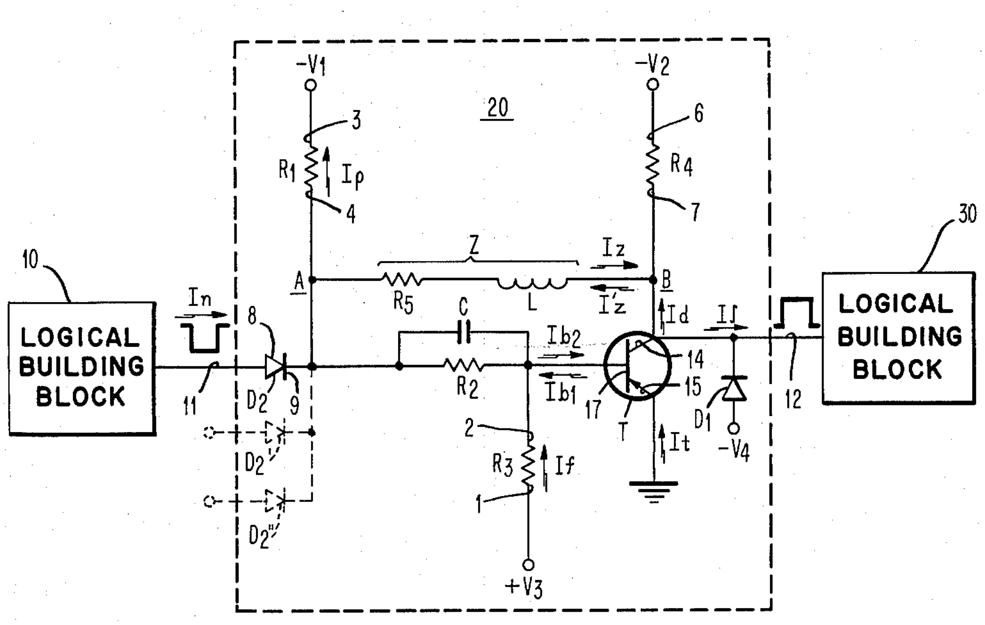
INVENTOR
CHARLES C. IH
BY Rene A. Kuypers
ATTORNEY United States Patent Office 3,204,122

Patented Aug. 31, 1965

3,204,122
TWO-WAY CURRENT STEERING SWITCHING CIRCUIT

Charles C. Ih, Philadelphia, Pa., assignor to Sperry Rand Corporation, New York, N.Y., a corporation of Delaware Filed Sept. 13, 1962, Ser. No. 223,403
1 Claim. (Cl. 307—88.5)

This invention relates to switching circuits and in particular, to a logic NOR gate which provides high speed switching.

One of the defects of prior art switching circuits has been the relatively slow speeds at which these devices have operated, i.e., the slow rise and fall times of the output pulses. Present day switching circuits that are used, for example, in logic circuits of high speed data processing equipment, require switching speeds that operate in the low nanosecond region. Presently known switching circuits which are able to generate such fast switching speeds are not readily available.

Another defect of prior art switching circuits has been the long stage delay encountered by an input pulse across the input-output terminals of the circuit. Such delays severely limit the speed with which high speed computers can operate when employing such circuits in a logic building-block chain.

Another defect of known prior art switching circuits has been the complicated nature of their design. High speed transistor switching is usually accomplished by alternately steering current into and out of the base electrode. The usual expedient employed to achieve this steering action is through the use of numerous diodes. It is well recognized that diodes are not as reliable nor rugged as other circuit components such as resistors, capacitors, inductors, etc., and therefore, their use in electronic circuitry not only complicates it but also limits its reliability.

It is therefore an object of this invention to provide an improved high speed switching circuit.

It is a further object of this invention to provide an improved solid state switching circuit.

It is a further object of this invention to provide a switching circuit that reduces circuit stage delay across the input-output terminals.

It is a further object of this invention to provide a high speed switching circuit that avoids the use of unilateral conducting devices, such as diode elements, in the current steering circuit.

In accordance with a feature of this invention, there is provided a bi-directional feedback circuit connected from the output electrode to the control electrode of a current conducting device. The bi-directional feedback means, since it employs no unilateral conducting element, such as a diode, enables additional current to be steered in one direction or the other, that is, either into or out of the control electrode of the current conducting device depending upon the state of the input circuit. The current which is steered into or out of the control electrode causes the switching circuit to be quickly "turned-on" or "turned-off" in accordance with the presence or absence of an input pulse. This is accomplished by incorporating in the feedback circuit a dynamic current source means which steers additional "turn-on" or "turn-off" current for the switching circuit, thereby enabling the output pulse to achieve fast rise and fall time.

The novel features that are considered characteristic of this invention are set forth with particularity in the appended claim. The invention itself, however, both as to its organization and method of operation, as well as additional objects and advantages thereof, will best be understood from the following description when considered in conjunction with the accompanying drawing, in which the diagram is a schematic of a circuit that utilizes a switching transistor.

In accordance with the invention, when a negative input pulse is applied to the switching circuit of the instant invention, the switching transistor of the circuit begins to conduct, and is extensively overdriven by the momentary surge current flowing from the bi-directional feedback circuit. This circuit action causes the rapid "turn-on" of the transistor and the rapid rise time of the output signal.

After the transistor is "turned-on" and achieves a steady-state condition, the switching transistor is kept in the least saturated state by a proper selection of circuit components as well as by the minimum beta (i.e., the ratio of collector current to base current with the collector voltage being held constant) of the transistor used. This feature provides the switching circuit with good transient response.

When the input signal is terminated at the switching transistor, additional "clean-up" current for rapid "turn-off" of the transistor is obtained from the momentary surge of current in the feedback circuit which is now flowing in the reverse direction. The action causes the rapid fall time of the output signal.

Referring particularly to the drawing, the switching circuit of the subject invention is disclosed within the block 20 which may be considered as an inverter circuit or as a logic NOR gate. Its operation is explained, by way of example only, in conjunction with logical building-block 10, which may be a logic AND, OR, or other NOR gate. Logical building-block 30, which may be similar to block 10, is connected to the output terminal 12. The subject invention is not necessarily limited to such an arrangement but it is explained in this manner for ease of understanding. The logical building-block 20 is composed primarily of a switching transistor T which is a PNP transistor having a base element 17, as well as collector and emitter electrodes 14 and 15, respectively. It is understood, of course, that an NPN transistor by reversing the input diodes and with proper voltage biasing, as well as other semiconductors or other current conducting devices could be utilized in the circuit without detracting from the spirit of the invention.

The anode 8 of gating diode D2 is connected to the input terminal 11 which is adapted to be connected to a negative input signal source and its cathode 9 is connected through a limiting resistor R2 to the base electrode 17 of transistor T. Gating diodes such as D'2 and D"2 could be added to the input circuit in order to receive other signals such for example as from other computer logic circuits. However, for the sake of simplicity, the invention will be explained with only one input signal which is applied at terminal 11. It is understood of course, that any or all of the input terminals which receive a negative signal will produce the same result. Connected across the resistor R2 is a "speed-up" capacitor C. Connected intermediate the diode D2 and resistor R2 is the first terminal 4 of a resistor R1; the second terminal 3 of resistor R1 is adapted to be connected to a first source of negative potential V1. The collector 14 of the transistor T is connected to a first terminal 7 of a resistor R4; the second terminal 6 of the resistor R4 is adapted to be connected to a second source of negative potential, V2.

Connected to the first terminals 4 and 7 of resistors R1 and R2, respectively, is a bi-directional feedback circuit consisting of an impedance Z which is composed of resistor R5 and an inductor L. Also connected to the base 17 of transistor T is a first terminal 2 of a resistor R3. The second terminal 1 of the resistor R3 is adapted to be connected to a positive source of potential, V3. The emitter 15 of transistor T is connected to ground potential. The output means of transistor T, which is connected to collector 14, is clamped by a diode D1 to a third source of negative potential, V4.

In the absence of an input signal at terminal 11 from logical building-block 10, the input source is at or near ground potential. Other values of input voltage may be used at the input circuit provided that suitable changes are made of certain circuit parameters. At this time (i.e., in the absence of an input signal) transistor T is non-conducting since the base 17 is biased slightly positive with respect to the emitter 15. The positive biasing voltage that is applied to the base electrode 17 is derived from the voltage drop across resistor R3 and is provided by current $I_f$ flowing through R3 from voltage source, V3. The current $I_f$ completes its circuit by flowing through resistors R2 and R1 to the negative voltage source, V1. The current $I_f$ is nearly constant and of small value compared to $I_p$ and $I_z$ and hence can be ignored for the purpose of further circuit analysis.

When transistor T is not conducting and the input terminal has no input signal pulse applied thereto, i.e., the input voltage is near ground potential, current $I_n$ flows through diode D2 to point A, where it is divided into two branches, $I_p$ and $I_z$. The current that flows through resistor R1 to the negative potential source, V1, is designated $I_p$; the current that flows through the bi-directional feedback circuit, resistor R5 and inductor L, to negative potential source, V2, is called $I_z$. Since $I_f$ is negligible, $I_n \approx I_p + I_z$.

A negative input pulse is then applied from the output of logic building-block 10 to terminal 11 of switching circuit 20. Current $I_n$ through diode D2 is immediately cut-off. Although $I_n$ is cut-off at the instant that the input pulse is applied and before the transistor T is "turned-on," a transient condition exists, due to the collapsing magnetic field in inductor L, wherein the current $I_z$ flowing in the feedback circuit cannot instantaneously change directions.

The current $I_z$ therefore that was flowing in the direction from A to B before the negative input pulse was applied to terminal 11, continues to momentarily flow in this direction after the negative pulse is applied. As indicated above, the current $I_z$ cannot at this moment change direction by flowing from B to A because the inductor L prevents such an instantaneous reversal of direction. The inductor therefore acts as a dynamic current source and $I_z$ continues to momentarily flow from A to B in the feedback circuit.

Switching transistor T then begins to conduct since the emitter-base junction becomes forward biased and conducting current $I_t$ begins flowing from ground potential, through the emitter 15 and through the collector 14. The current leaving the collector 14 is divided into two branches $I_d$ and $I_1$.

Simultaneously during the "turning-on" of transistor T, part of current $I_z$ flows to the load 30 while the remaining portion flows through resistor R4, to negative source V2, to ground, through emitter 15, and out of the base 17. The momentary surge of current from the inductor L is in addition to the normal "turn-on" current $I_p$ that flows out of the base 17 when transistor T begins to conduct. Therefore, the total current, during the transient period, that flows out of the base 17 is approximately equal to $I_p+I_z$.

The momentary surge of current from the bi-directional feedback circuit, through the base 17, causes the switching transistor T to be extensively over-driven and hence, it is quickly "turned-on." The quick turn-on of transistor T is aided by the action of the "speed-up" capacitor C which provides a low impedance path for the base current. The fact that the transistor T is quickly over-driven in response to the heavy base current $(I_p+I_z)$ accounts for the rapid rise time of the output signal.

Current $I_1$ is the load current and flows to terminal 12 and further to the load provided by logical building-block 30. As soon as current $I_t$ begins to flow, the collector 14 and therefore the output pulse rises to nearly ground potential. Since the transistor circuit is of the common-emitter type, the output pulse is inverted from the input pulse.

The circuit after a period of time determined by the time constant of the feedback circuit assumes a steady-state condition and since A is negative with respect to B, the current flow $I_z$ in the feedback circuit reverses itself and current $I'_z$ now flows from B to A. $I'_z$ is derived from current $I_d$, which is divided into two branches, namely, $I'_z$ and $I_d-I'_z$. The current $I_p-I'_z$, which is so determined that the transistor is just saturated, continues to flow out of the base element 17 and through resistors R2 and R1 to minus voltage source V1. Keeping the transistor T in the least saturated state materially enhances its transient response. During the steady-state period, the current $I'_z$ flowing from points B to A is approximately equal to the current flowing from A to B. This is because the shifting of the voltage levels of A and B are about the same. During the steady-state period the current flow through resistor R2 and out of the base 17 is equal to $I_p-I'_z$ and is designated $I_{b1}$.

After the input signal is terminated and the input level returns to ground potential, the transistor T will stop conducting since the base 17 will be again slightly positive with respect to the emitter 15.

The current $I'_z$ however cannot instantaneously change direction and flow from point A to point B in the feedback circuit because of the delaying effect of the inductor L and therefore continues to momentarily flow into the base terminal 17 of transistor T. Current $I'_z$ momentarily flowing into the base 17, provides additional "clean-up" current to the normal "clean-up" current, $I_n-I_p$, which quickly neutralizes the stored minority carriers in the transistor T. The total current flowing into the base is considered the "turn-off" current and is designated $Ib2$. A low impedance path is provided for $Ib2$ by the "speed-up" capacitor C. This "clean-up" or "turn-off" current quickly causes the transistor T to be switched off and hence a fast fall time of the output pulse occurs. After a short period of time, the current in the feedback circuit again flows from point A to point B and the current $I_p+I_z$ is satisfied by the current $I_n$ from block 10; thus the switching cycle is then completed and the circuit is conditioned to receive the next input pulse.

With the "two-way" feedback circuit that is the subject of the instant invention, switching speeds have been improved five times faster than other known switching devices and the delay time, that is, the delay generated when a pulse is applied to the input and removed from the output terminal, has been reduced to less than one-half of that of the same circuit without the "two-way" feedback network. This latter improvement is of prime significance when the subject switching circuit is used as a logic circuit in a logic building-block chain because it materially increases the speed with which data processing machinery can operate. With the present fast transistors available, a rise time of less than two nanoseconds was observed in the circuit described.

In summary, the instant invention provides fast "turn-on" and "turn-off", as well as limiting the delay across the input-output terminals, of a current conducting device by providing across the control and output terminals thereof a bidirectional feedback circuit. The feedback circuit steers additional "turn-on" current out of the control electrode of the current conducting device to produce a fast rise time of the output pulse, as well as steering additional "turn-off" current into the control electrode in order to generate a fast fall time of the output pulse.

The embodiments of the invention in which an exclusive property or privilege is claimed are defined as follows:

A switching circuit comprising:

(a) a current conducting device having input, output and control elements;

(b) first, second, and reference voltage potentials, said input element of said current conducting device being connected to said reference potential;

(c) a first resistor having first and second terminals said first terminal being connected to said first source of potential and second terminal being connected to said output element of said current conducting device;

(d) a second resistor having first and second terminals, said first terminal connected to said second source of potential and said second terminal connected to said control element of said current conducting device;

(e) feedback means, comprising a third resistor and an inductor in series connection, connected to said respective second terminals of said first and second resistors;

(f) input circuit means having first and second terminals, said second terminal being connected to said control element of said current conducting device and said first terminal adapted to be connected to an input signal source having first and second voltage levels, said feedback means conducting current in a first direction through said first resistor and to said first source of potential when said input signal source is at said first voltage level, said current being transmitted to said input element of said current conducting device when said input signal source changes from a first to a second voltage level, said current in said feedback means changing direction and flowing in said second direction to said second source of potential via said second resistor after said current has been transmitted to said control element, said current which is being conducted in said feedback means in said second direction being transmitted to said control element of said current conducting device when said input signal source returns to said first voltage level from said second voltage level after which said current in feedback means again conducts in said first direction.

References Cited by the Examiner

UNITED STATES PATENTS

| | | | |
|---|---|---|---|
| 3,105,159 | 9/63 | Ditkofsky | 307—88.5 |
| 3,157,795 | 11/64 | Pressman | 307—88.5 |

ARTHUR GAUSS, *Primary Examiner.*